(12) United States Patent
Larking

(10) Patent No.: US 7,579,697 B2
(45) Date of Patent: Aug. 25, 2009

(54) ARRANGEMENT FOR HIGH FREQUENCY APPLICATION

(75) Inventor: John E. Larking, Dartford (GB)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 12/157,364

(22) Filed: Jun. 10, 2008

(65) Prior Publication Data

US 2008/0246127 A1    Oct. 9, 2008

Related U.S. Application Data

(62) Division of application No. 11/523,254, filed on Sep. 19, 2006, now Pat. No. 7,397,137, which is a division of application No. 10/620,020, filed on Jul. 15, 2003, now Pat. No. 7,119,447.

(60) Provisional application No. 60/396,484, filed on Jul. 15, 2002.

(51) Int. Cl.
*H01L 29/41* (2006.01)

(52) U.S. Cl. .................. 257/784; 257/666; 257/706

(58) Field of Classification Search ............ 257/666, 257/676, 678, 692, 706, 707, 778, 784
See application file for complete search history.

(56) References Cited

U.S. PATENT DOCUMENTS

| | | |
|---|---|---|
| 3,561,107 A | 2/1971 | Best et al. |
| 3,871,014 A | 3/1975 | King et al. |
| 3,972,062 A | 7/1976 | Hopp |
| 4,021,838 A | 5/1977 | Warwick |
| 4,392,151 A | 7/1983 | Iwatani |
| 4,454,454 A | 6/1984 | Valentine |
| 4,604,644 A | 8/1986 | Beckham et al. |
| 4,639,760 A * | 1/1987 | Granberg et al. ............ 257/705 |
| 4,646,129 A | 2/1987 | Yerman et al. |
| 5,075,759 A * | 12/1991 | Moline ....................... 257/692 |
| 5,182,632 A | 1/1993 | Bechtel et al. |
| 5,217,922 A | 6/1993 | Akasaki et al. |
| 5,311,402 A | 5/1994 | Kobayashi et al. |
| 5,313,366 A | 5/1994 | Gaudenzi et al. |
| 5,367,435 A | 11/1994 | Andros et al. |

(Continued)

FOREIGN PATENT DOCUMENTS

EP    0 966 038    12/1999

(Continued)

OTHER PUBLICATIONS

Mosfet BGA Design Guide 2004, Fairchild Semiconductor.

(Continued)

*Primary Examiner*—Thomas L Dickey
(74) *Attorney, Agent, or Firm*—Farjami & Farjami LLP

(57) ABSTRACT

A source mounted semiconductor device package is described which includes a semiconductor die having first and second opposing major surfaces, first and second major electrodes disposed on respective major surfaces and a control electrode disposed on the second major surface, and a thin metal clip electrically connected to the first major electrode of the die. The thin metal clip has a relatively large surface area, and package resistance which is caused by skin effect phenomenon is reduced thereby in high frequency applications.

13 Claims, 17 Drawing Sheets

U.S. PATENT DOCUMENTS

| | | |
|---|---|---|
| 5,371,404 A | 12/1994 | Juskey et al. |
| 5,381,039 A | 1/1995 | Morrison |
| 5,394,490 A | 2/1995 | Kato et al. |
| 5,397,921 A | 3/1995 | Karnezos |
| 5,447,886 A | 9/1995 | Rai |
| 5,448,114 A | 9/1995 | Kondoh et al. |
| 5,454,160 A | 10/1995 | Nickel |
| 5,455,456 A | 10/1995 | Newman |
| 5,477,087 A | 12/1995 | Kawakita et al. |
| 5,510,758 A | 4/1996 | Fujita et al. |
| 5,512,786 A | 4/1996 | Imamura et al. |
| 5,532,512 A | 7/1996 | Fillion et al. |
| 5,554,887 A | 9/1996 | Sawai et al. |
| 5,578,869 A | 11/1996 | Hoffman et al. |
| 5,654,590 A | 8/1997 | Kuramochi |
| 5,672,992 A * | 9/1997 | Nadd ........................ 327/390 |
| 5,703,405 A | 12/1997 | Zeber |
| 5,726,489 A | 3/1998 | Matsuda et al. |
| 5,726,501 A | 3/1998 | Matsubara |
| 5,726,502 A | 3/1998 | Beddingfield |
| 5,729,440 A | 3/1998 | Jimarez et al. |
| 5,734,201 A | 3/1998 | Djennas et al. |
| 5,739,585 A | 4/1998 | Akram et al. |
| 5,814,894 A | 9/1998 | Igarashi et al. |
| 5,841,183 A | 11/1998 | Ariyoshi |
| 6,051,888 A | 4/2000 | Dahl |
| 6,133,634 A | 10/2000 | Joshi |
| 6,262,489 B1 | 7/2001 | Koors et al. |
| 6,303,974 B1 | 10/2001 | Irons et al. |
| 6,391,687 B1 | 5/2002 | Cabahug et al. |
| 6,720,647 B2 | 4/2004 | Fukuizumi |
| 6,744,124 B1 | 6/2004 | Chang et al. |
| 7,119,447 B2 * | 10/2006 | Larking ..................... 257/784 |
| 2001/0048116 A1 * | 12/2001 | Standing et al. ............. 257/177 |

FOREIGN PATENT DOCUMENTS

| | | |
|---|---|---|
| EP | 0 978 871 | 2/2000 |
| JP | 0 113142 | 5/1989 |
| JP | 5-129516 | 5/1993 |
| JP | 07-202064 | 8/1995 |
| JP | 11-054673 | 2/1999 |
| JP | 11195680 | 7/1999 |
| JP | 2000-243887 | 9/2000 |
| WO | WO 99/65077 | 12/1999 |

OTHER PUBLICATIONS

Supplementary European Search Report dated Sep. 28, 2007 in European Patent Application No. 01922828.7.

* cited by examiner

| SKIN DEPTH MILS | FREQUENCY[MHz] | | | | | | |
|---|---|---|---|---|---|---|---|
| | 0.1 | 0.25 | 0.5 | 0.75 | 1 | 2.5 | 5 |
| Al | 10.4 | 8.56 | 4.66 | 3.8 | 3.20 | 2.08 | 1.47 |
| Cu | 8.2 | 5.20 | 3.68 | 3.0 | 2.60 | 1.64 | 1.16 |

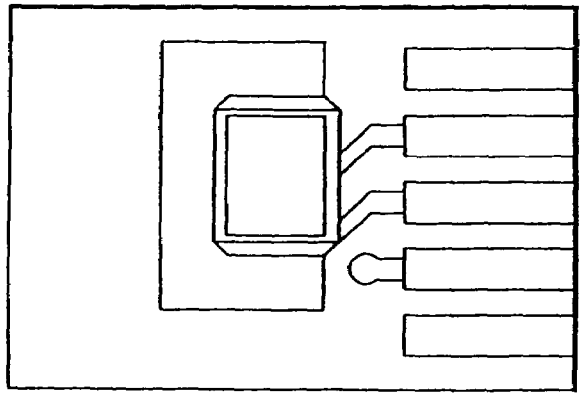
FIG.7C DEVICE UNDER TEST (DUT) CARD
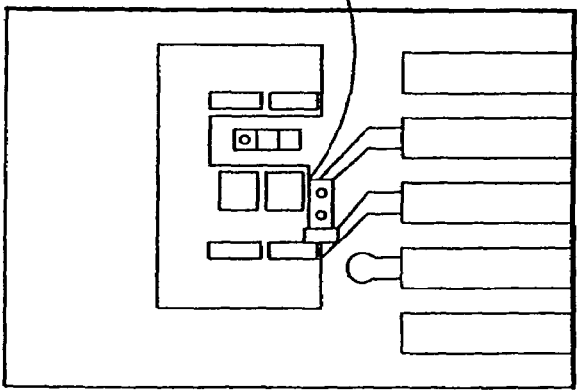
FIG.7B SHORT CIRCUIT TEST CARD
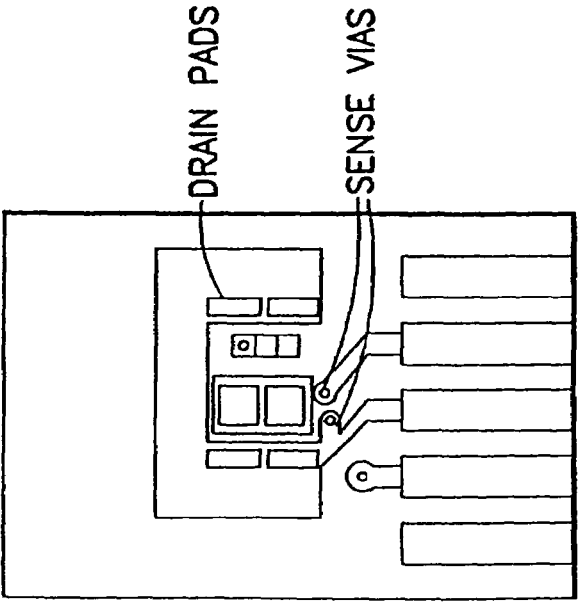
FIG.7A OPEN CIRCUIT TEST CARD

| PACKAGE | BOARD MOUNTED DIE FREE PACKAGE RESISTANCE [mOhm] | | BOARD MOUNTED DIE FREE PACKAGE INDUCTANCE [nH] | |
|---|---|---|---|---|
| | 500KHz | 4MHz | 500KHz | 4MHz |
| D2-PAK | 2.0 | 5.0 | 5.0 | 4.8 |
| D-PAK | 2.6 | 4.9 | 2.4 | 2.3 |
| SO-8 | 2.7 | 4.1 | 1.6 | 1.5 |
| MLP | 5.2 | 4.9 | 1.6 | 1.4 |
| PACKAGE 2 4 | 0.9 | 1.8 | 0.5 | 0.4 |

FIG.13

ARRANGEMENT FOR HIGH FREQUENCY APPLICATION

CROSS REFERENCE TO RELATED APPLICATIONS

This application is a division of U.S. application Ser. No. 11/523,254, filed Sep. 19, 2006 entitled DIRECT FET DEVICE FOR HIGH FREQUENCY APPLICATION which is a division of U.S. application Ser. No. 10/620,020, filed Jul. 15, 2003 entitled DIRECT FET DEVICE FOR HIGH FREQUENCY APPLICATION which is based on and claims priority to U.S. Provisional Patent Application No. 60/396,484, filed on Jul. 15, 2002, entitled DIRECT FET DEVICE FOR HIGH FREQUENCY APPLICATION, the entire contents of which are incorporated herein by reference.

BACKGROUND OF THE INVENTION

The performance demands on server computer systems, desktop computers, personal digital assistants ("PDA's"), cellular telephones and other electronic devices have led to substantial demands for improved microprocessor performance, for example, measured in clock speed. Power is typically supplied to a microprocessor from a fixed 12V supply rail using a point of load converter or voltage regulator module ("VRM"). In order to supply a fast transient current response, as required by the microprocessor, converter frequencies have been increased to over 1 megahertz (MHz) and, in many cases, multiphase designs have been adopted.

Next generation microprocessors operate at voltages approaching 1 volt (V) and at escalating frequencies. Current requirements are increasing rapidly, increasing the need for very fast transient response. Since 1999, transient response has increased from 20 A per microsecond to about 325 A per microsecond, and is projected to grow to 400 A per microsecond within a year. To address challenges, for example, to shrink the large capacitor banks that would otherwise be required, buck converters must operate at high frequencies, above the 1 MHz range. At such high frequencies, switching losses become critical due to PCB trace inductance and power package parasitics. This has led industry experts to believe that an integrated solution is needed to reach such high switching frequencies.

Prior art semiconductor device packages are produced with a variety of configurations. One such configuration is shown in FIG. 1.

Referring to the drawing figures in which like reference numerals refer to like elements, there is shown in FIG. 1 a prior art semiconductor device package 10 that includes a molded housing 12 which has disposed therein a semiconductor power switching device (not shown). The electrodes of the power semiconductor switching device contained within molded housing 12 of semiconductor device package 10 are electrically connected to respective external leads. Typically, at least one external lead serves as an input lead 14, while another external lead functions as an output lead 16. Other external leads may function as ground connection 18, a control lead 20 for carrying a control signal, and a ($V_{cc}$) lead 22.

Operating power MOSFET devices over 1 MHz poses challenges to existing power electronic packages (e.g., D-PAK, D2PAK and the wirebonded SO-8 devices).

It has been found that external leads, such as the ones included with semiconductor device package 10 of FIG. 1, exhibit increased resistance at high RF operating frequencies, and particularly at frequencies greater than about 1 MHz. It is believed that the increase in resistance at high RF frequencies is due to skin effect, a phenomenon which causes the flow of carriers to move toward the exterior surface of the external leads. Skin effect is an electromagnetic phenomenon in which current flowing through a material of a given cross sectional area is confined to the perimeter of that area, especially at elevated frequencies. The skin effect restricts the current to a small cross-section of external leads, thereby increasing the overall resistance of the semiconductor device package and making it less suitable for high frequency applications.

It is, therefore, desirable to have a semiconductor device package that does not exhibit the increased resistance in its external connections due to the skin effect.

SUMMARY OF THE INVENTION

The application relates to a semiconductor device package, and more particularly to a surface mounted semiconductor package having a reduced overall resistance at high frequencies.

An object of the present invention is to provide a semiconductor device package which exhibits a lower overall resistance at high frequencies.

Another object of this invention is to reduce the overall resistance of a semiconductor device package at high frequencies by reducing the resistance of its external connections to high frequency applications.

The foregoing and other objects of the present invention are realized by a semiconductor device package, which includes a semiconductor die having first and second opposing major surfaces, first and second major electrodes disposed on respective first and second major surfaces of the die, a control electrode disposed on at least one major surface of the die, and a thin metal clip electrically connected to the other major electrode of the die. It is believed that because the thin metal clip has a relatively large surface area it exhibits less resistance to high frequency currents which may be caused by the skin effect phenomenon. Also, it is believed that because the clip is relatively thin it exhibits higher resistance to eddy currents, which in turn reduces loss due typically to heat generation by excessive eddy currents.

Other features and advantages of the present invention will become apparent from the following description of the invention which refers to the accompanying drawings.

BRIEF DESCRIPTION OF THE DRAWINGS

The invention will now be described in greater detail in the following detailed description with reference to the drawings in which:

FIGS. 7A-7H show examples of circuit test boards that extract parasitic impedance from a semiconductor package of the present invention;

FIG. 13 is a table summarizing package parasitic resistance and inductances measured at 500 KHz and at 4 MHz;

DETAILED DESCRIPTION OF THE DRAWINGS

Figure 1:
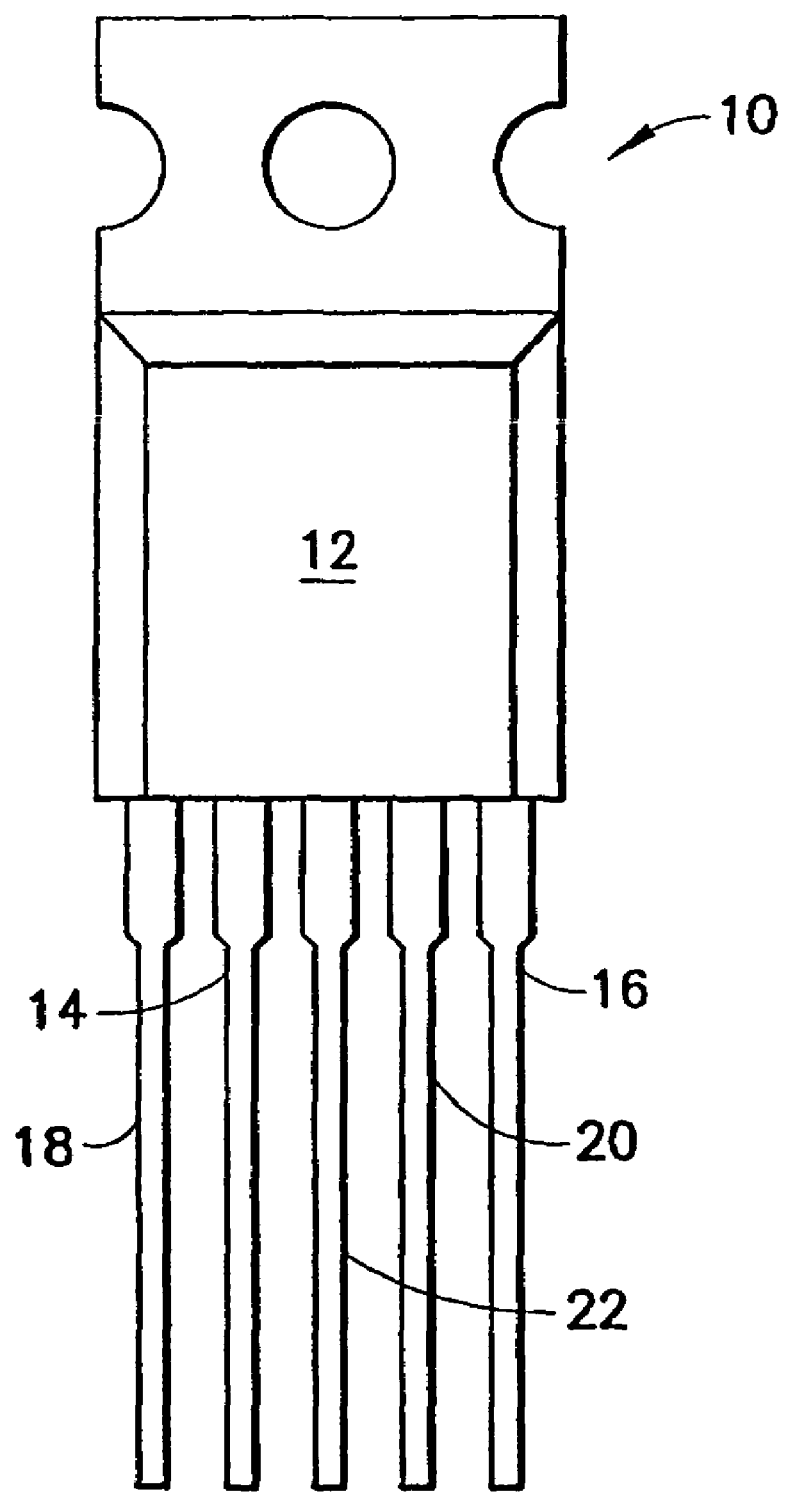
FIG. 1 shows a prior art semiconductor device.
Figure 2:
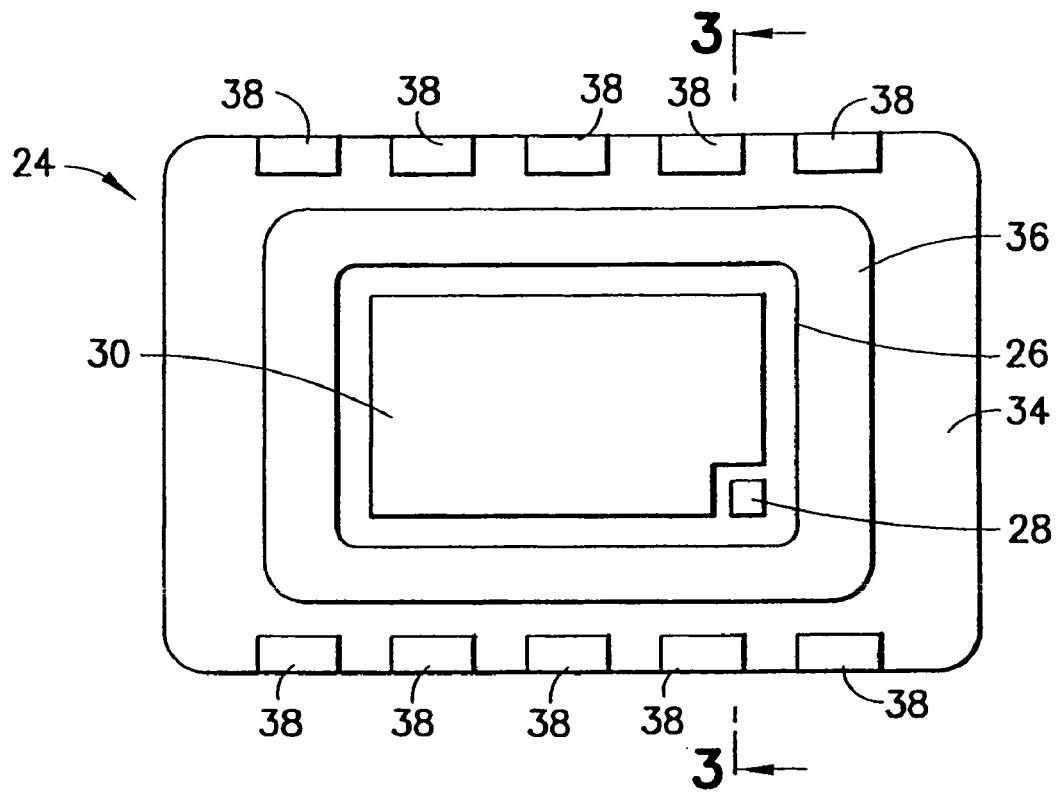
FIG. 2 shows a bottom view of a semiconductor device according to the first embodiment of the present invention.
Figure 3:
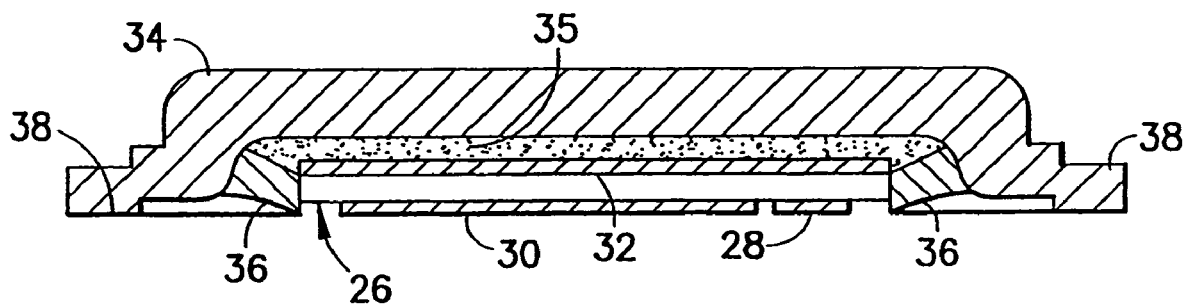
FIG. 3 shows a cross-sectional view of the device shown in FIG. 2 along line 3-3 looking in the direction of the arrows shown.

FIG. 2 shows a bottom view of a semiconductor device package 24 according to an embodiment of the present invention. According to this embodiment, a MOS-gated power semiconductor device 26, such as a MOSFET, having gate electrode 28 and source electrode 30 on a major surface thereof, and drain electrode 32 (FIG. 3) on another opposing major surface thereof, is received in cup-shaped clip 34, which may be made from copper and optionally silver plated. Clip 34 may also be laminated. Cup-shaped clip 34 has an internal portion greater in length and width than power semiconductor device 26. As a result, cup-shaped clip 34 has more surface area than the drain electrode 32. Drain electrode 36 of power semiconductor device 26 is connected to the interior surface of cup-shaped clip 34 by a conductive epoxy 35 (FIG. 3). Preferably, a low stress, high adhesion epoxy is deposited around power semiconductor device 26, thereby providing a ring 36 of epoxy which occupies the space between the edges of power semiconductor device 26 and cup-shaped clip 34. Cup-shaped clip 34 includes two rows of projections 38, which are disposed at opposing edges of cup-shaped clip 34. Projections 38 on each edge of clip 34 may be replaced by a single projection, or may be eliminated from cup-shaped clip 34 to provide a cup-shaped clip having coplanar edges.

Clip 34 may be varied in size as necessary depending on the size of the die it is to receive. For example, for a die size of up to 4.04×3.38 mm, clip 34 may be 6.30 mm×4.9 and have the maximum height of 0.464 mm resulting in the clip to die ratio of 2.26, for a die size of up to 6.5×5.45 mm, clip 34 may be 9.10×6.95 mm and have the maximum height of 0.533 mm resulting in the clip to die ratio of 1.78, and for a die size of up to 2.59×2.31 mm, clip 34 may be 4.80 mm×3.55 mm and have the maximum height of 0.533 mm resulting in the clip to die ratio of 2.84. Of course, clips of other sizes may also be used. In a preferred embodiment, cup-shaped clip 34 is 0.25 mm thick. The surface area of cup-shaped clip 34 may be, depending on the size of the die used, 30.87 mm$^2$, 63.25 mm$^2$ or 17.04 mm$^2$.

In accordance with a preferred embodiment of the present invention, a passivation system on the die 26 isolates the gate and the source pads to prevent shorting and acts as a solder mask when the device is mounted on a printed circuit board ("PCB"). The passivation layer also protects the termination and gate structures from moisture and other contamination. The clip 34 forms the drain connection 32 from the die to the board. Such a design eliminates the lead-frame and wire bonds, thereby reducing die-free package resistance (DFPR) to a mere 0.1 mOhm in an SO-8 footprint compared to 1.5 mOhm for a standard SO-8 package. It is believed that the large-area contacts combined with the copper housing significantly improve heat dissipation, compared to a SOIC plastic molded package. More particularly, the junction-to-PCB thermal resistance is reduced to 1° C./W, compared to 20° C./W for a standard SO-8 package. The clip 34 provides a heat sink surface and improves top junction-to-case thermal resistance to 3° C./W compared to 18° C./W, for a SO-8.

With the use of heat sinks and cooling air flow, the semiconductor device package 24 can dissipate more heat out of the top of the package and reduce junction temperature by up to 50° C. Effective top-side cooling means that heat is dissipated and can be pulled away from the circuit board, thereby increasing the currents that the device can safely carry. High top $R_{th(j-c)}$ explains why standard and derivative SO-8 packages are only used with single-side cooling through the PCB.

It has been found that cup-shaped clip 34 reduces the overall resistance of semiconductor device package 24 for high frequency currents. Through experimentation, described in detail below, it has been found that the resistivity in clip 34 depends, in part, on the width of the region that is available for current flow, and the length of the path traversed by the current. This relationship may be generally represented as R=resistivity×Length/Area. It is also found that at high frequencies, eddy currents will restrict the cross sectional area of the clip 34 that is available for current flow by forcing current to flow towards the edges of clip (i.e., the skin effect). Therefore, it is believed that the thickness of clip 34 needs to be at least 4 skin depths to allow current to pass with a minimum of resistive losses. Increasing the thickness of clip 34 to more than 10 skin depths is not expected to result in a lower resistance at high frequency. However, increasing the thickness of clip 34 does increase the cross sectional area of the package that is available for thermal transfer. Thus, when, due to the skin effect, current is pushed to the surface of cup-shaped clip 34, the device exhibits less overall resistance. Advantageously, due to its relatively low thickness, cup-shaped clip 34 exhibits higher resistivity to eddy currents. The high resistivity to eddy currents leads to less loss of energy through heat that is generated by excessive eddy currents.

The above-conclusions were made during experimentation and testing of, in part, die free packages. One of the test packages was an embodiment of a source mounted semiconductor device package according to the present invention, and the other was a conventional surface mounted TO-220 device, assembled with 3×15 mil diameter aluminum wirebonds between the bond post and the drain lead paddle with now power die in place. In order to obtain the die free package resistance of the source mounted package of the present invention, the MOSFET die was replaced by a copper "slug" of equivalent dimensions to the power MOSFET die normally housed within the package. The devices were assembled onto a printed circuit board test card.

Figure 4:
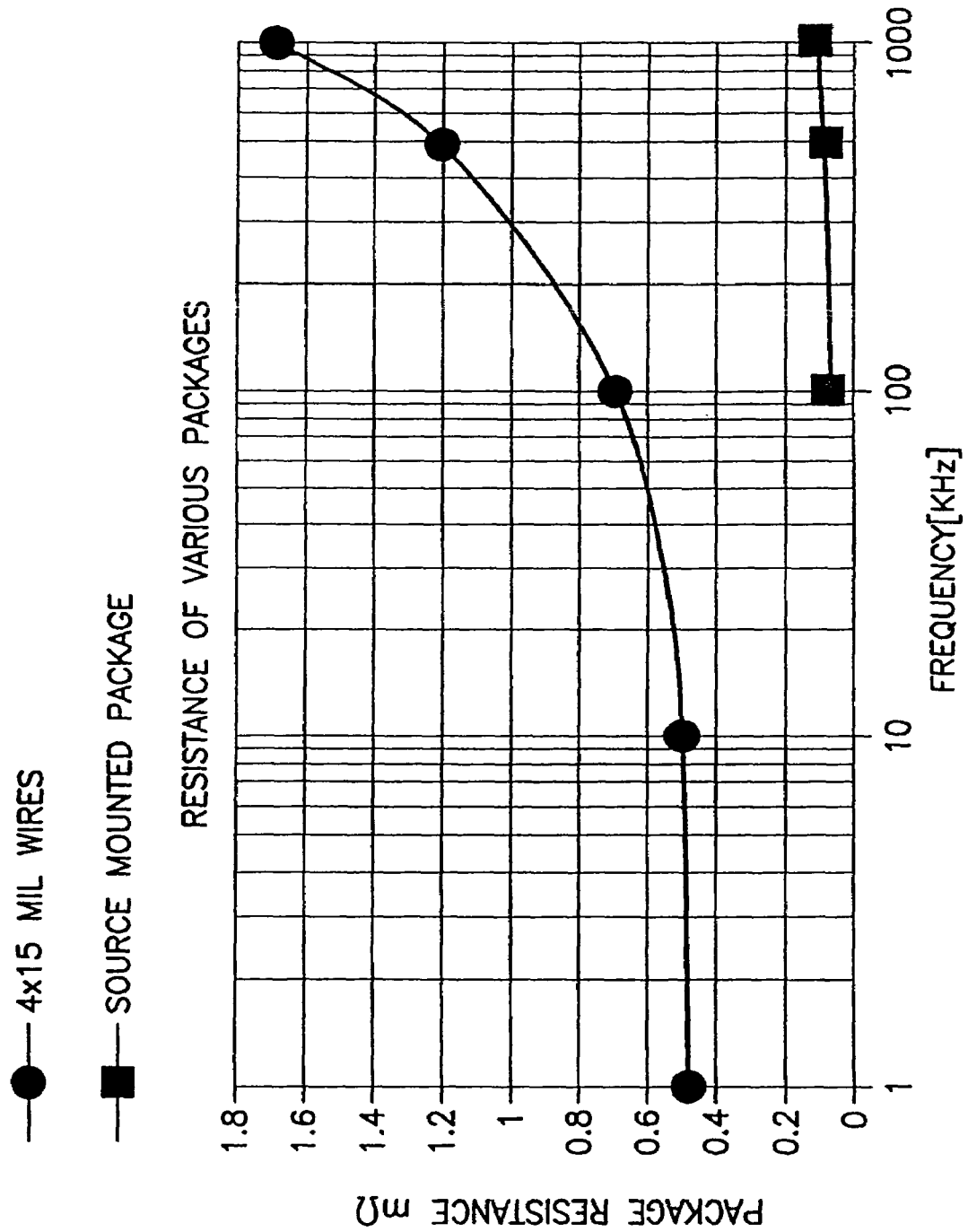
FIG. 4 is a graph showing resistance of two semiconductor device packages versus frequency.

The graph shown in FIG. 4 illustrates the resistance of two semiconductor device packages: a source mounted clip-based power package according to the present invention, and a TO-220 package versus frequency. The measured resistance includes the track resistance of the printed circuit board under the packages.

The graph shown in FIG. 4 reveals that the resistance of the source mounted package design of the present invention increases at a significantly lower rate with frequency than that of the TO-220 device. The DC package resistance is also significantly lower to begin with due to increased area available for conduction in the clip 34 of the source mounted power package.

The sharp increase in the package resistance of the TO-220 device shown in FIG. 4 is believed to be due to the skin effect. The skin depth of a conductor of cross section, A, is given by the relationship:

$$\delta = [\rho/(\pi\mu f)]^{1/2}$$

where δ is the skin depth, ρ is the resistivity of the conductor, μ is the relative permeability of the conductor and f is the frequency of operation.

Figures 5, 6:
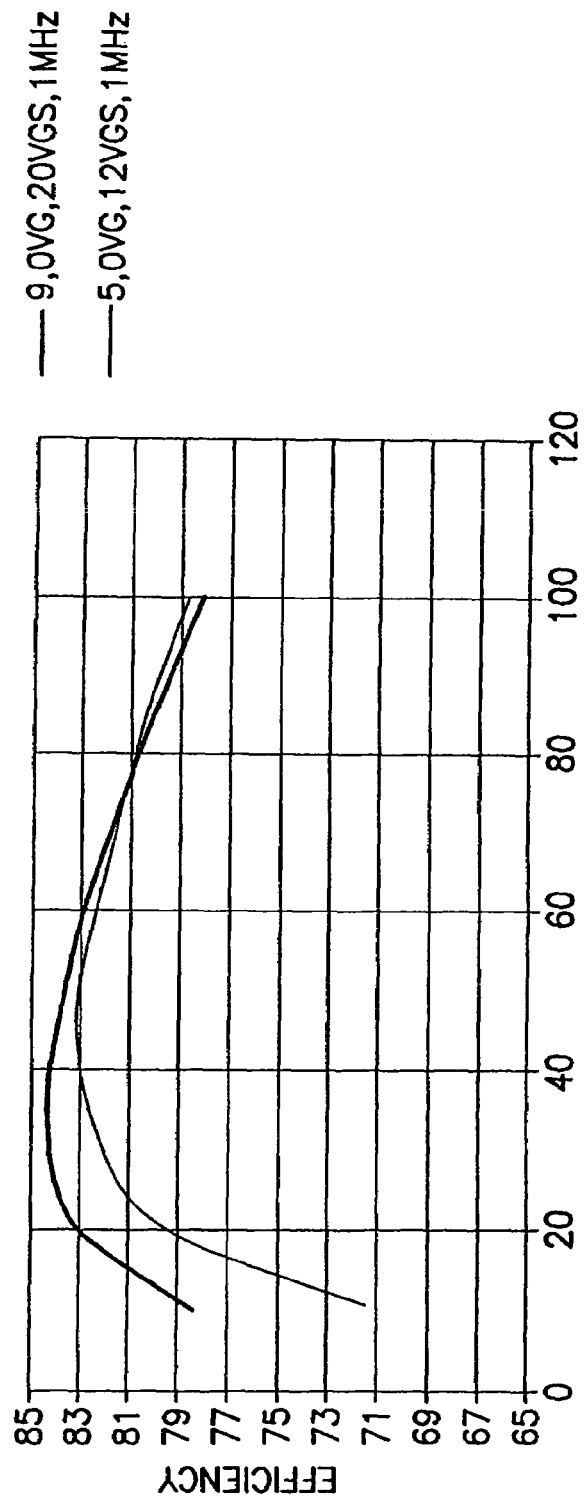
FIG. 5 is a table showing skin depth in aluminum and copper over a range of frequencies.
FIG. 6 shows a graph of efficiency curves of a source mounted package in accordance with the present invention.

The table shown in FIG. 5 charts the skin depth of copper and aluminum as a function of frequency. The table shows the skin depth of aluminum at 1 MHz is 3.29 mils. This is significantly less than the 15 mils diameter wires used in the TO-220 package construction (not shown) and will, therefore, reduce the cross sectional area of the wire available for current conduction.

The resistance measurements, identified in the chart shown in FIG. 4, were made using the AC internal sine wave signal of an LCR meter. The Vds switching waveforms in DC:DC converter operation are more similar to square waves. Fourier analysis of such a wave operating at 1 MHz results in significant energy at up to 5 harmonics of the fundamental frequency. The package impedance at these frequencies is significantly higher in the table than shown in FIG. 4.

In further testing, a semiconductor device package of the present invention was evaluated in a 4 phase PWM buck converter circuit, over a range of output currents. Efficiency data were collected operating the circuit with Vin=12V, Vout=1.7V and a switching frequency of 1 MHz.

The graph shown in FIG. 6 illustrates a comparison of efficiency between 20 VGS parts and 12 VGS parts on a 4 oz. Cu board. The graph identifies efficiency curves of a source mounted semiconductor device package, in accordance with the present invention, measured in a 4-phase PWM circuit and operating at 1 MHz. The efficiency curves are measured as a function of output current. The data show that the in circuit efficiency varies both as a function of gate drive voltage and output current. Efficiencies obtained were in the regions of 70 to 84% over the range of 10 to 100 A output current. This corresponds to a current of 25 A per phase. These levels of efficiency and current are not possible using the same power MOSFET housed in wirebonded packages, such as a SO-8 and TO-220 power packages.

As noted above, semiconductor device packages of varying configurations were assembled with the silicon die removed. Included were D-PAK, D2PAK, MLP and SO-8 devices, which had wirebonds placed on the silicon bond pad of the device leadframe. Care was taken to ensure that the wirebonds occupied the same x-y coordinates on the die bond pads as they would normally occupy in the packages containing silicon. In addition to the prior art packages that were tested, die free samples of a source-mounted package, in accordance with the present invention, were assembled by replacing the silicon die with a stamped copper die of equivalent dimensions to the original silicon. This was believed necessary in order that the underside of the clip 34 could be brought into contact with the source electrode printed circuit board pads.

Devices were assembled onto test cards fabricated from double-sided FR4 with 2 ounce copper tracking. SN62PB362AG near eutectic no clean solder (Multicore SN62MP100AGS90) was screen-printed onto test cards prior to component pick and place. After, component placement test cards were re-flowed using a standard JEDEC profile and visually inspected for defects.

Resistance and inductance measurements were performed using an Agilent/HP4285A high precision LCR meter. A custom designed test fixture was used to interface the device test cards to the LCR output current source/voltage sense (Kelvin) terminals. The test procedure was as follows:

1) Insert 'open circuit test card' into test fixture & perform OPEN circuit correction.

2) Insert 'short circuit test card' into test fixture & measure SHORT circuit R and L values.

3) Insert device test card into test fixture and measure LOAD R and L.

Figure 7F:
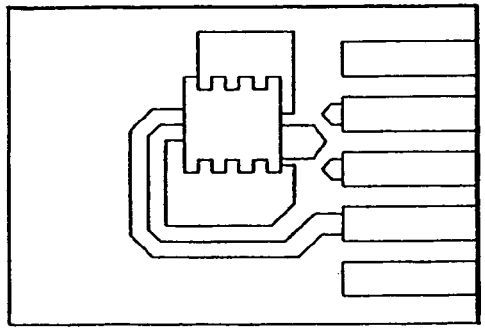
Figure 7E:
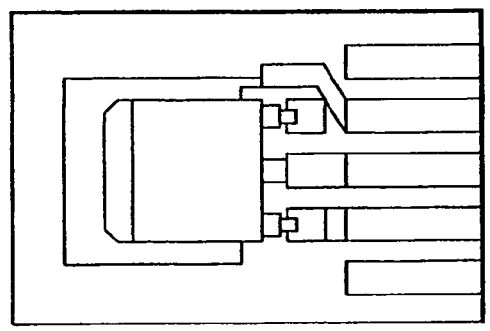
Figure 7D:
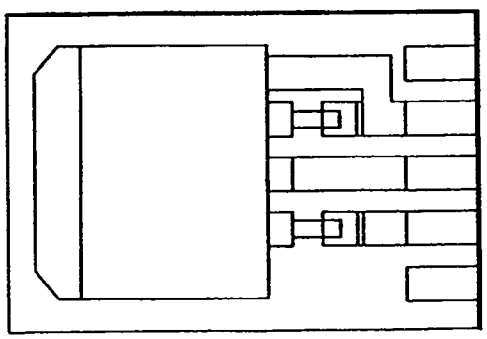
Figure 7H:
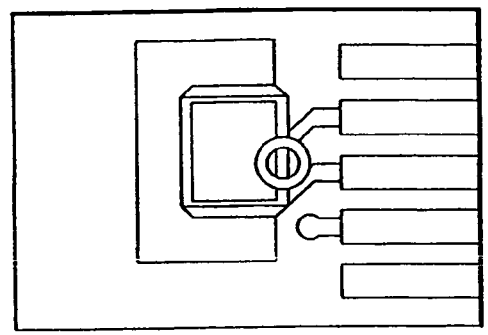
Figure 7G:
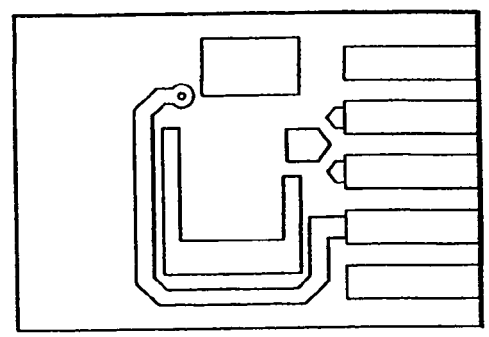

The test cards used to extract parasitic impedances from the DirectFET packages are shown in FIGS. 7A, 7B and 7C. FIG. 7A shows the OPEN circuit test card used to back correct the LCR meter sense pins. During testing, current was forced through the front side gate, drain, and source connections as shown in FIG. 7A as G, D and S, respectively. Sense vias were routed along the rear side of the test cards (not shown). FIGS. 7B and 7C illustrate the short circuit test card and the device under test, or DUT, test card, respectively, used during testing. In order to obtain low resistance short circuit measurements, the drain and source sense via holes were located close to the edge of the package, or, where possible, underneath the package leads and close together. The resultant short circuit obtained between sense vias was calculated to be in the region of 40 uOhms. The track impedances from the sense vias to the land pads of the devices under test are included in the experimental results. The results presented below are, therefore, for board mounted packages, as opposed to discrete packages. The test card designs for each of the packages investigated are illustrated in FIGS. 7D, 7E, 7F, 7G and 7H. The test cards shown in FIGS. 7D, 7E, 7F, 7G and 7H are a D2PAK, a D-PAK, an SO-8 package, an MLP package, and a source mounted package in accordance with the present invention, respectively. The circle shown in FIGS. 7D-7H highlights the location of the sense vias. Effort was made to ensure the sense vias were placed close to the device under test in order to reference out as much track impedance in the measurements.

Figure 8:
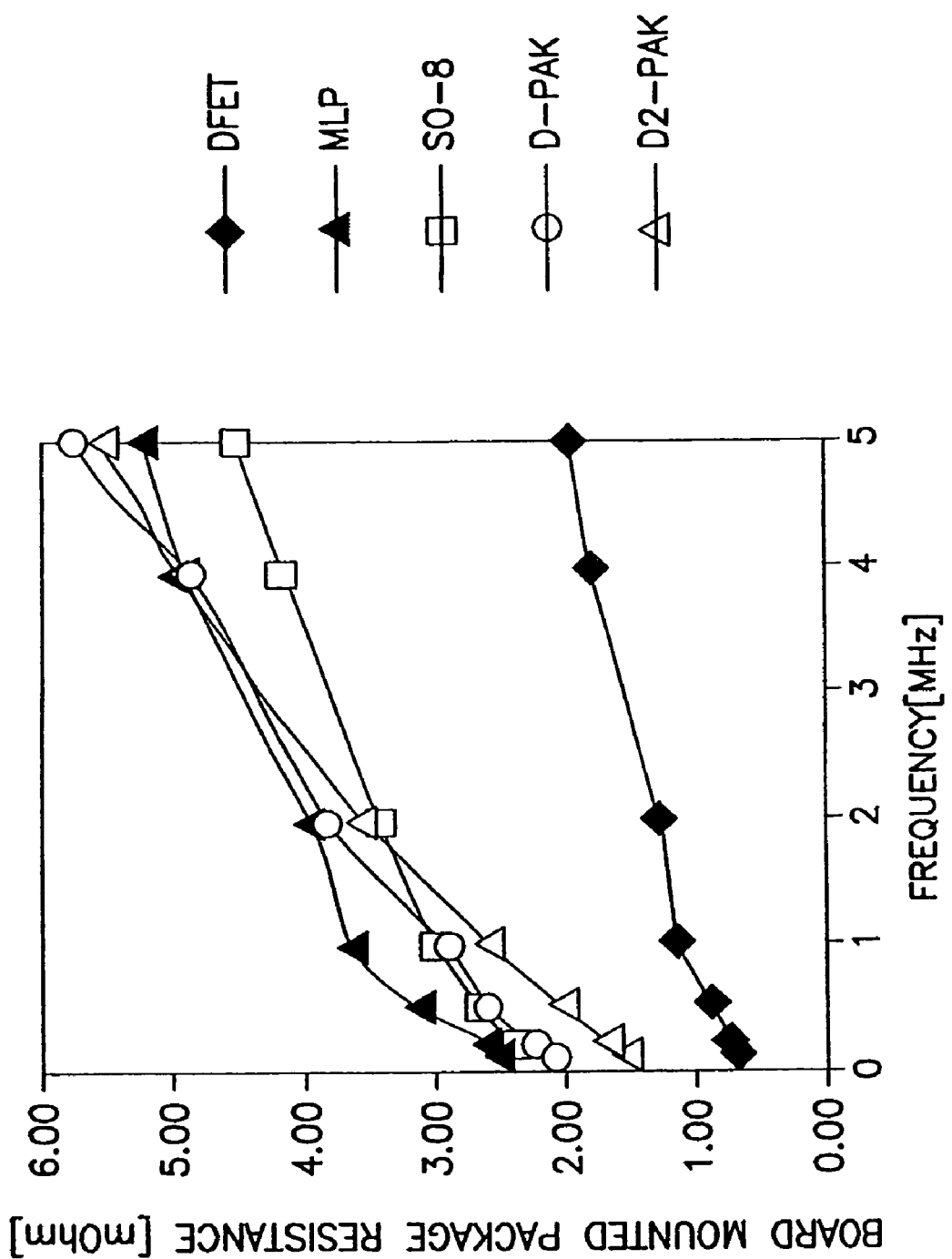
FIG. 8 is a graph showing board mounted package resistance versus frequency for a plurality of package.

FIG. 8 shows the board mounted package resistance versus frequency for each of the packages characterized. The semiconductor device package according to the present invention shows the lowest board mounted package resistance from DC up to 5 MHz. At frequencies of 1 MHz and above, surface mount devices based upon conventional lead packages, such as the D2PAK and D-PAK, show very significant increases in package resistance in relation to values measured at DC.

Each mounted package represented in FIG. 8 exhibits a characteristic increase in resistance corresponding with increasing frequency. This is expected to be a consequence of skin effect. For a flat plate of copper, or wire bond, for example, skin depth is given by the equation:

$$\delta = (\rho/\pi\mu_0 f)]^{1/2}$$

where δ is the skin depth in m, ρ is the material resistivity, μ is the permeability of free space, and f is frequency.

Figure 9:
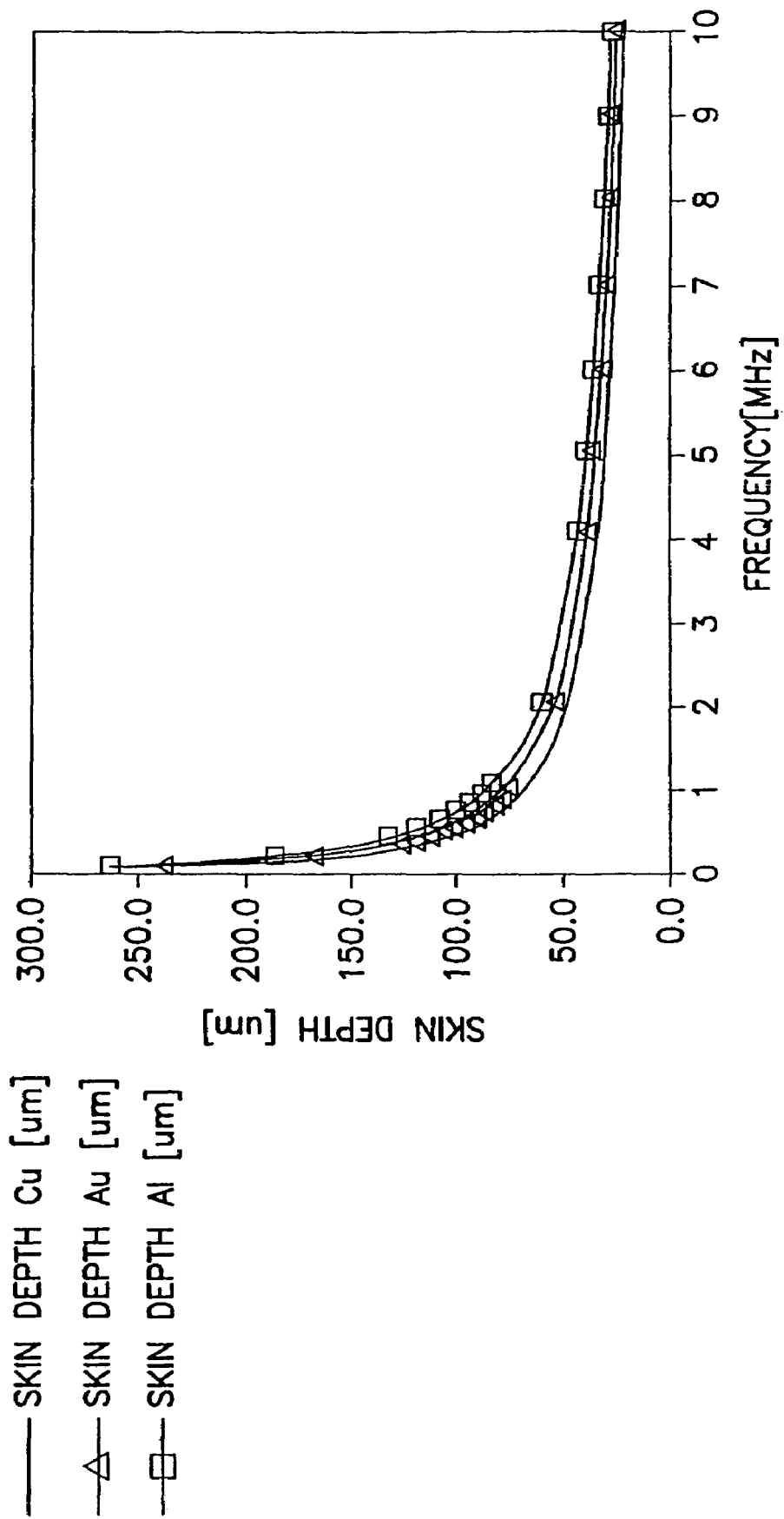
FIG. 9 is a graph showing the variation in skin depth with frequency for the electrical conductors gold, copper and aluminum.

The graph shown in FIG. 9 shows the variation in skin depth for three common metals utilized in power electronics packaging: copper, aluminum and gold. At a frequency of 1 MHz the skin depth for copper is approximately in the region of 60 um. This is significantly lower than the typical leadframe thickness of an SO-8 device (not shown) for example, which is in the region of 250 um.

The frequency dependence of the resistance and inductance of a rectangular shape of metal or circular cross section wire can be modeled using Maxwell's equations. Resistance can be shown to be a function of the ratio of plate thickness, t, over skin depth, δ.

Figure 10:
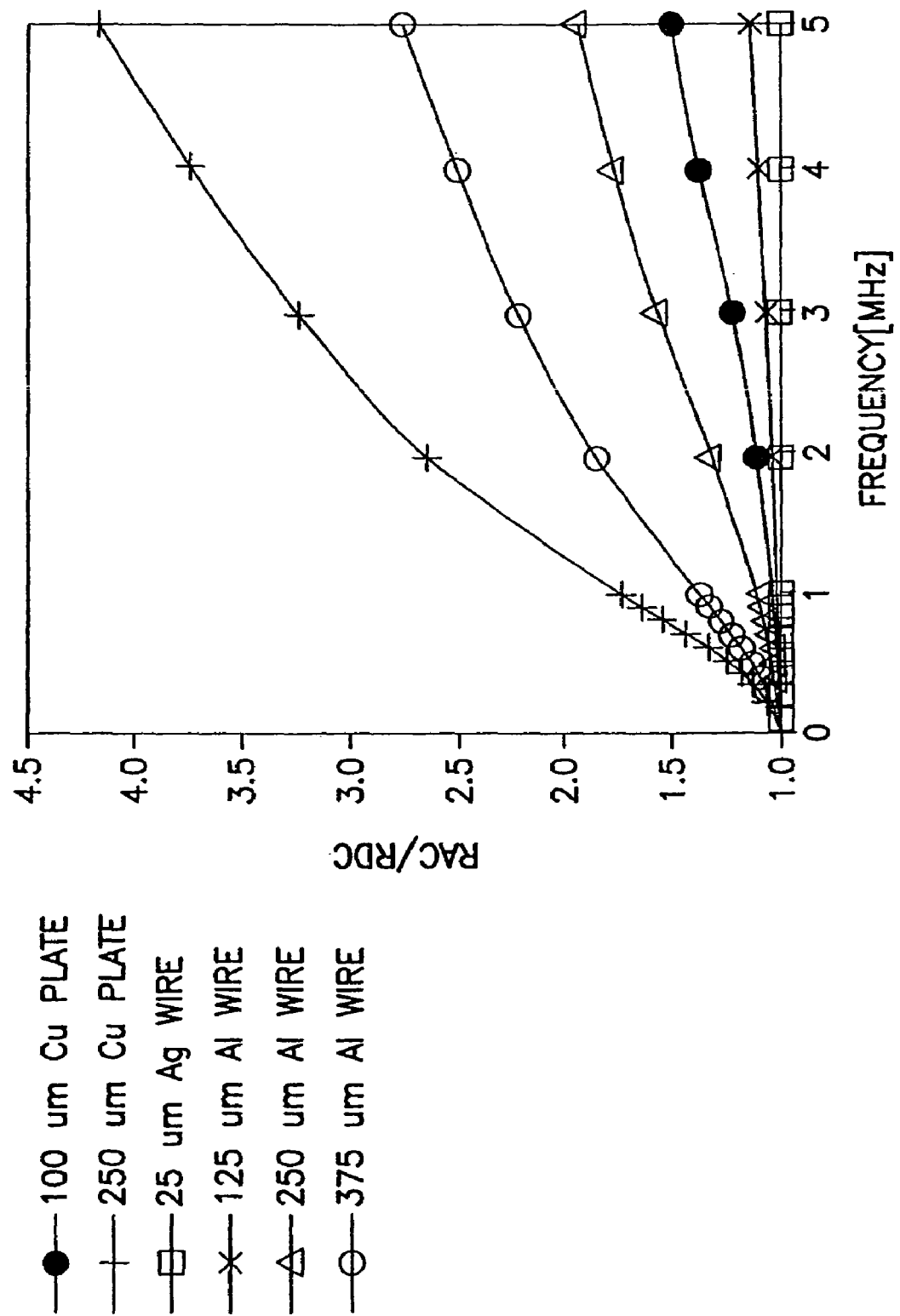
FIG. 10 is a graph that shows modeled resistance of plate and wire geometries varying with frequency.

The graph in FIG. 10 shows how the modeled resistances of plate and wire geometries vary with frequency. At 1 MHz the ratio of AC to DC modeled resistance of a plate of 250 μm thickness is approximately 1.7. At higher frequencies the resistance ratio increases further as the AC resistance increases. While these models are only approximations, they highlight the effects that skin depth has on typical materials used in electronic packaging at frequencies above 1 MHz.

Figure 11:
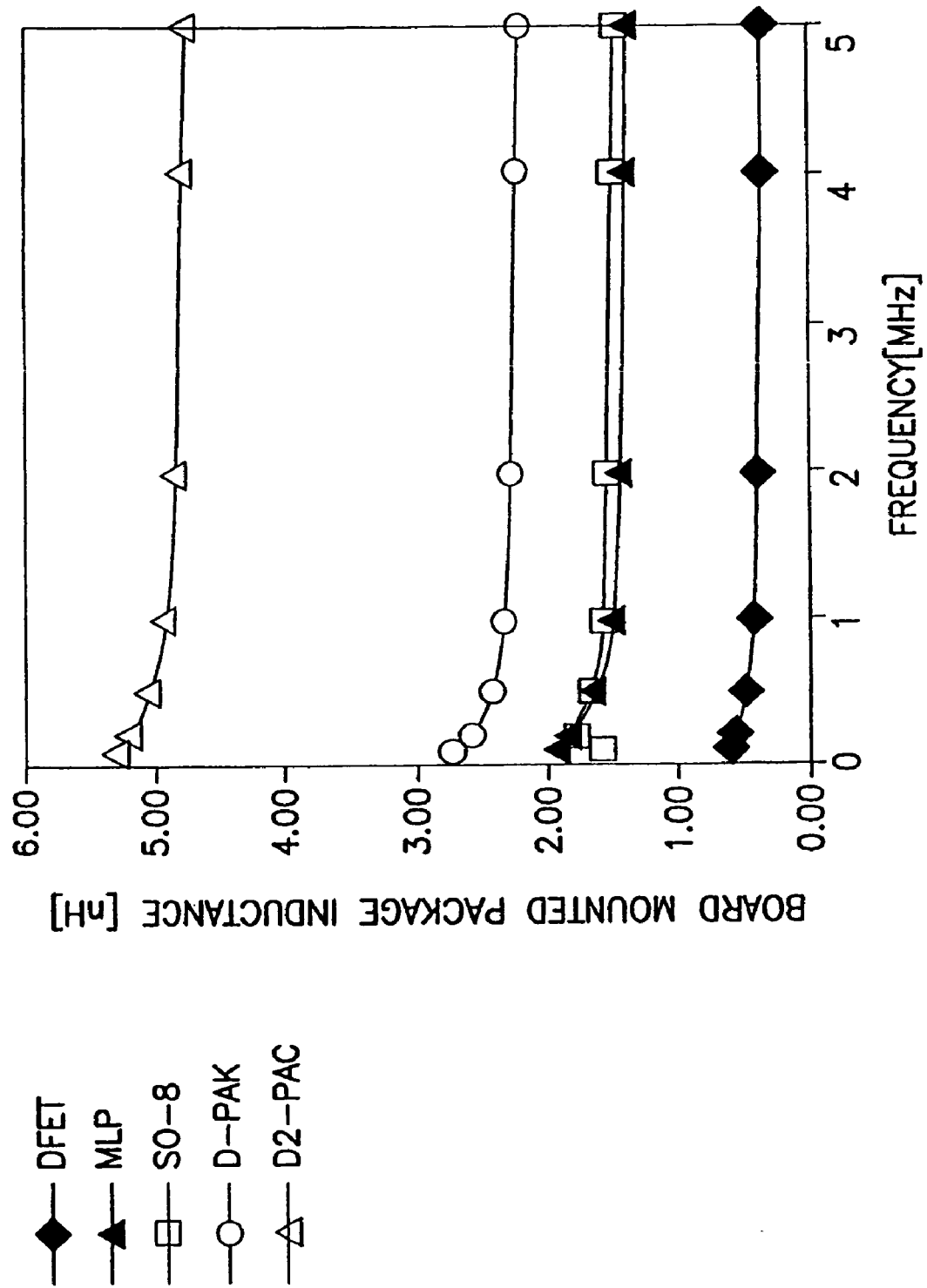
FIG. 11 is a graph showing board mounted package inductance versus frequency.

The graph in FIG. 11 shows the board mounted die free package inductance versus frequency curves for a range of power electronic packages. Inductance in the source mounted package of the present invention is significantly lower than that of the more conventional wirebonded packages such as D2PAK, D-PAK and SO-8. The D2PAK package exhibits the highest inductance of all packages tested, exhibiting inductance values up to five times those measured for the semiconductor device package of the present invention. This is believed to be a consequence of the length of package leads and internal 15 mil aluminum wirebonds in the D2PAK device. D-PAK packages, while not displaying as high inductance as D2PAKs, also show inductance values significantly higher than SO-8, MLP packages as well as the semiconductor device package 24. Again this is likely to be a consequence of the length of external package leads and internal 8 mil diameter aluminum wires. The package inductance characteristics shown in FIG. 11 display a decreasing trend in inductance with increasing frequency. Models based upon solving Maxwell's equations for a uniform current density conductor have shown that the ratio of AC to DC inductance is also a function of the ratio of plate thickness to skin depth.

Figure 12:
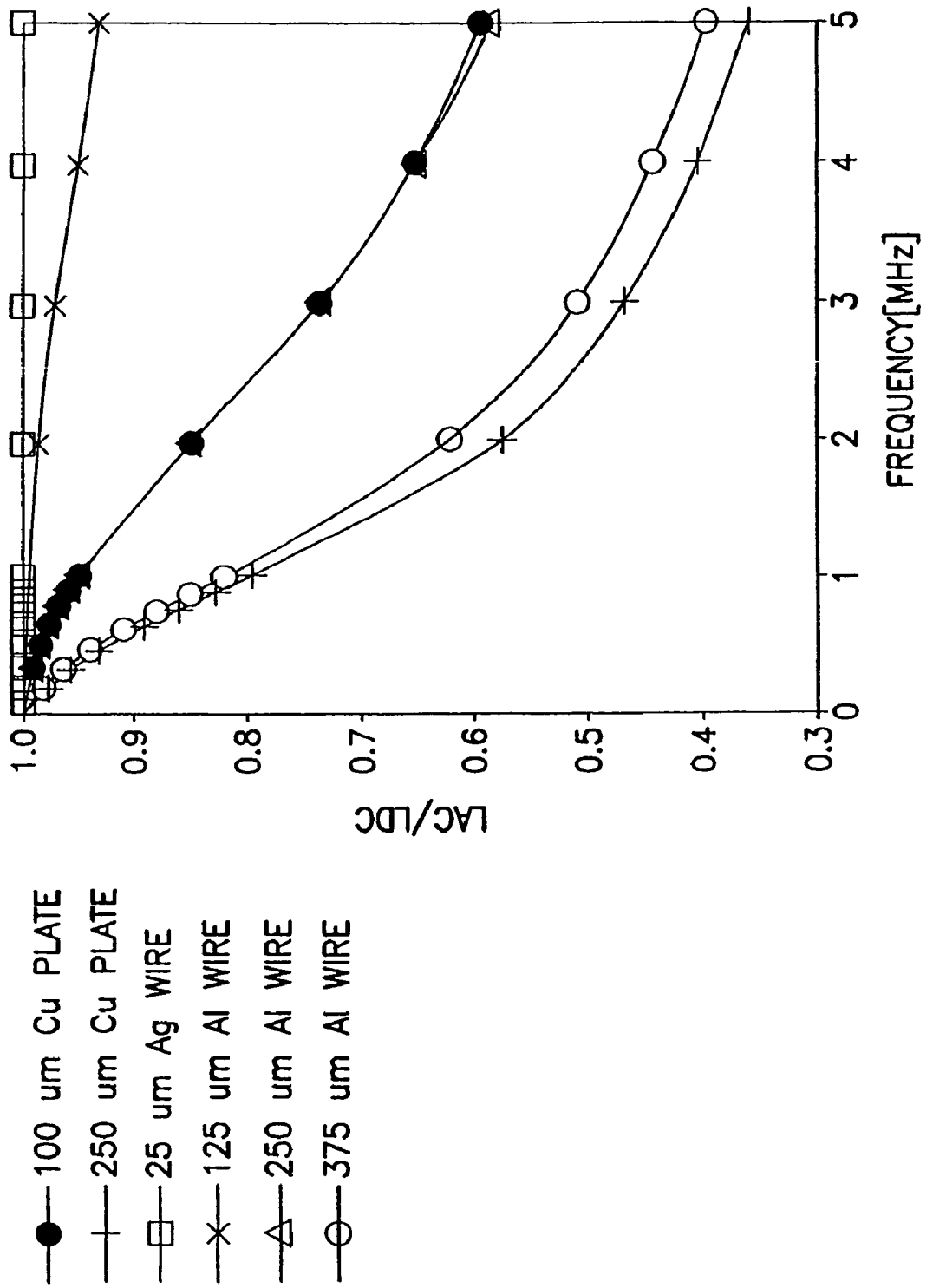
FIG. 12 is a graph showing modeled inductance versus frequency for a range of electronic materials common in power electronic packaging.

The graph in FIG. 12 shows the modeled inductance versus frequency for a range of electronic materials common in power electronic packaging. As with the resistance models, the results are only approximate, but highlight that the decreasing trend in inductance with frequency can be understood by applying Maxwell's equations to simple geometries. The graph shown in FIG. 12 confirms that larger thickness geometries are expected to show an earlier onset to inductance change with frequency. It should be noted that this behavior is not observed in the graph shown in FIG. 11.

A summary of the package parasitic resistance and inductances measured at 500 KHz and at 4 MHz are presented in the table shown in FIG. 13. Semiconductor device packages of the present invention show the greatest change in package inductance with frequency over the range of 500 KHz and 4 MHz, producing a 20% and 12.5% drop in inductance respectively. D2PAK and D-PAK devices show a 4% drop in inductance, while SO-8 shows a 6.25% drop over the frequency range measured.

The die free package resistances presented in the table of FIG. 13 include contributions from circuit board routing underneath the package footprint of each mounted device. In the case of the semiconductor device package of the present invention, the additional board parasitics and resistance of the copper dummy die add an estimated 0.6 mOhms to the DC die free package resistance. The actual die free package resistance is expected to be less than 100 μOhms. Board tracking contributions in the region of 0.5 mOhms may also be subtracted from the DC package resistances of the D2PAK, D-PAK, MLP and SO-8 device data. Extracting the board parasitics at frequencies above 500 KHz, however, is more prone to error due to the presence of skin effect within the circuit tracking. For this reason the data presented above have not been corrected to remove the circuit board tracking parasitics present underneath each device. In many cases this can be considered a more realistic representation of package capability in circuit.

Figure 14:
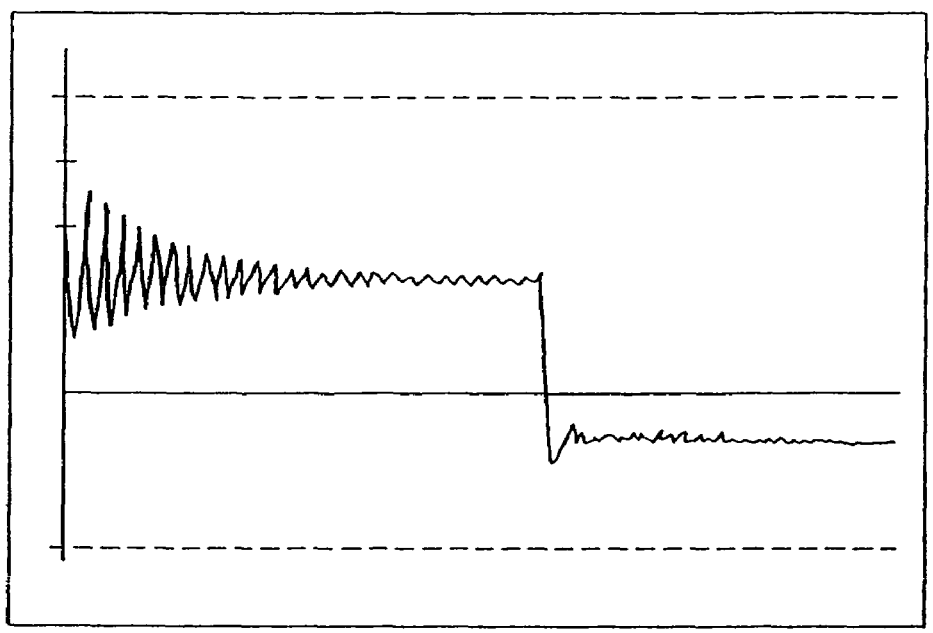
FIG. 14 is an image of in circuit Vds switching wave forms of an SO-8 package device.

Switching waveforms of an SO-8 packaged device, and a semiconductor device package of the present invention were measured in a 2-phase 1U VRM circuit operating at 500 KHz per phase. In order to highlight the effect of package parasitics on switching performance, silicon of the near identical active area, voltage and generation were used in both packages. FIG. 14 is a representation of a captured waveform of an SO-8 circuit switching 30 amps. Note the presence of inductance related ringing on the peak of the voltage trace. A similar waveform captured from a package in accordance with the present invention, including a circuit switching 30 amps is shown in FIG. 15.

Figure 15:
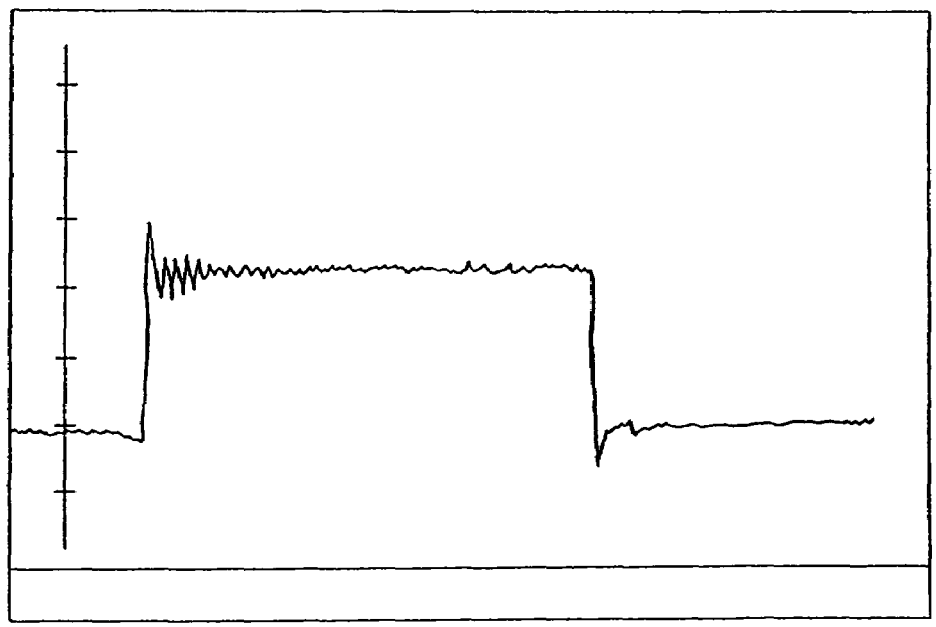
FIG. 15 is an image in circuit Vds switching waveforms of a semiconductor package device according to the present invention.

Comparing the two waveforms shown in FIGS. 14 and 15 demonstrates that the package in accordance with the present invention produces considerably lower peak ringing voltages in circuit than that of the SO-8 device. The ratio of peak ringing voltages observed in each waveform can be used to estimate the ratio of inductances between the two packages by using the relationship V=LdI/dt, where L is the peak current being switched, L is the board mounted package inductance and dt is the switching rise time. The ratio of package 24 to SO-8 package inductance calculated using this approximation is 0.32, which is consistent with the measured ratio of board mounted package inductances, 0.31 (0.5 nH/1.6 nH).

Testing has shown 4 phase VRM's constructed from semiconductor device packages of the present invention are capable of switching up to 120 A at 1 MHz. Reducing the effects of package parasitics can be used to further increase the VRM operating frequency to at least 2 MHz.

Figure 16:
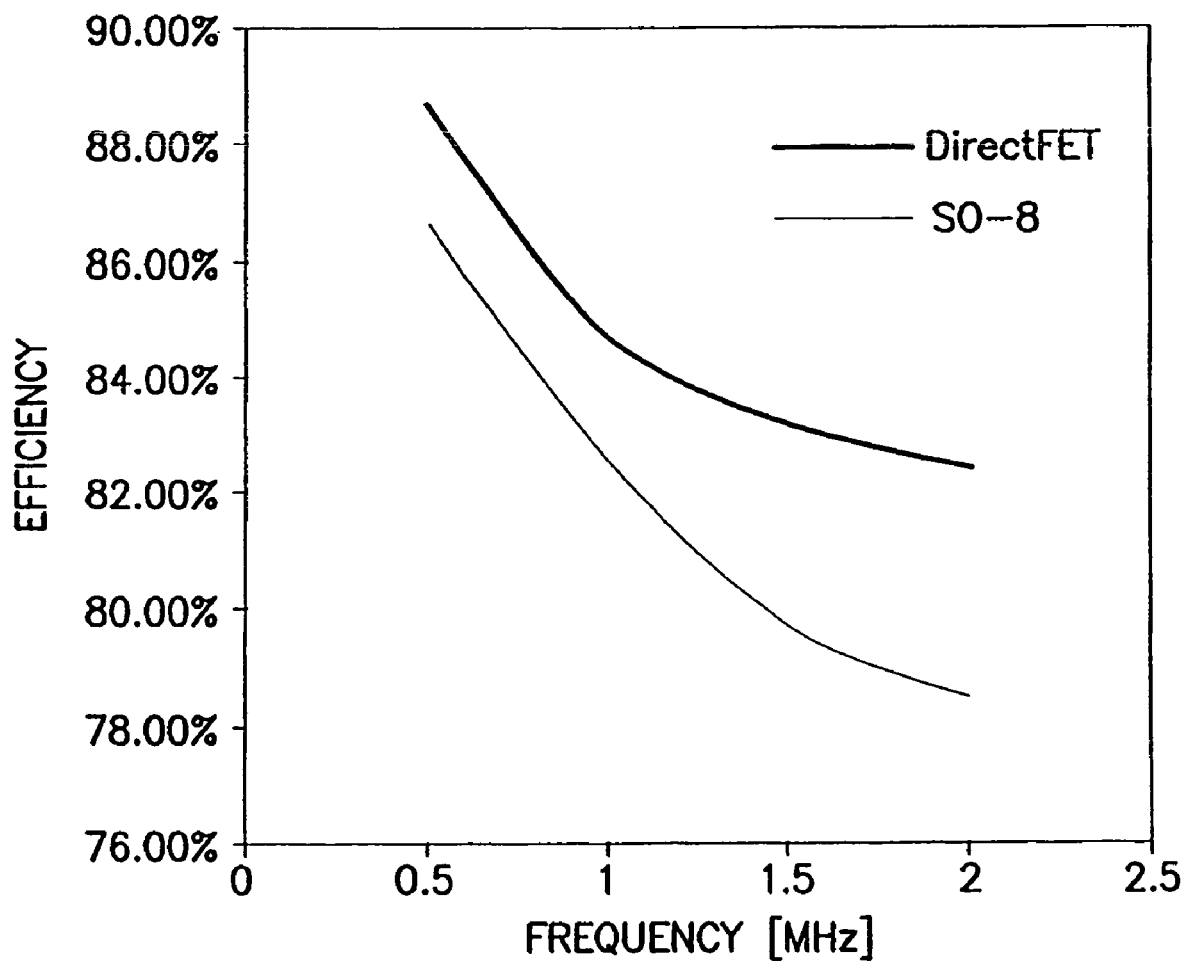
FIG. 16 is a graph representing efficiency versus frequency curves of an SO-8 package device, and a package device of the present invention.

The graph shown in FIG. 16 represents the efficiency versus frequency curves of a semiconductor device package of the present invention (package 24) and SO-8 devices operating in 2-phase VRM circuits. In both sets of devices tested, the silicon technology and active areas were kept near identical. Both circuits containing SO-8 package device and package 24 were cooled using a heatsink attached to the underside of the circuit boards. In both circuits, a positive airflow of 400 LFM was directed onto the heatsinks during recording of the efficiency data. The VRM circuits containing package 24, packaged silicon show higher efficiencies than their SO-8 counterparts across the frequency spectrum measured.

The difference in efficiency between the two circuits represented in the graph shown in FIG. 16 also increases with increasing frequency. This result reflects the reduced package parasitic losses in the semiconductor package of the present invention device relative to those of the SO-8. Moreover, the semiconductor package device of the present invention were also able to operate under higher load current conditions than the SO-8 package device. For example at 1 MHz the package 24 circuits were able to switch up to 60 A while maintaining a board temperature of less than 100 C. SO-8 devices, on the contrary, were only able to switch in the region of 40 A under identical operating conditions. The higher current handling capability of the package 24 populated VRM circuits is attributable to the combination of lower package parasitics and the increased thermal performance of the package 24.

The semiconductor device package of the present invention allows heat to be removed directly from the top of the package can assembly, as well as through the can leads into the board. This is referred to as "dual sided cooling." In SO-8 packages, dual sided cooling is less efficient due to the presence of mold compound between the top surface of the silicon and the surrounding ambient. In this situation the majority of heat is removed from the silicon through the package leads into the circuit board.

Figure 17:
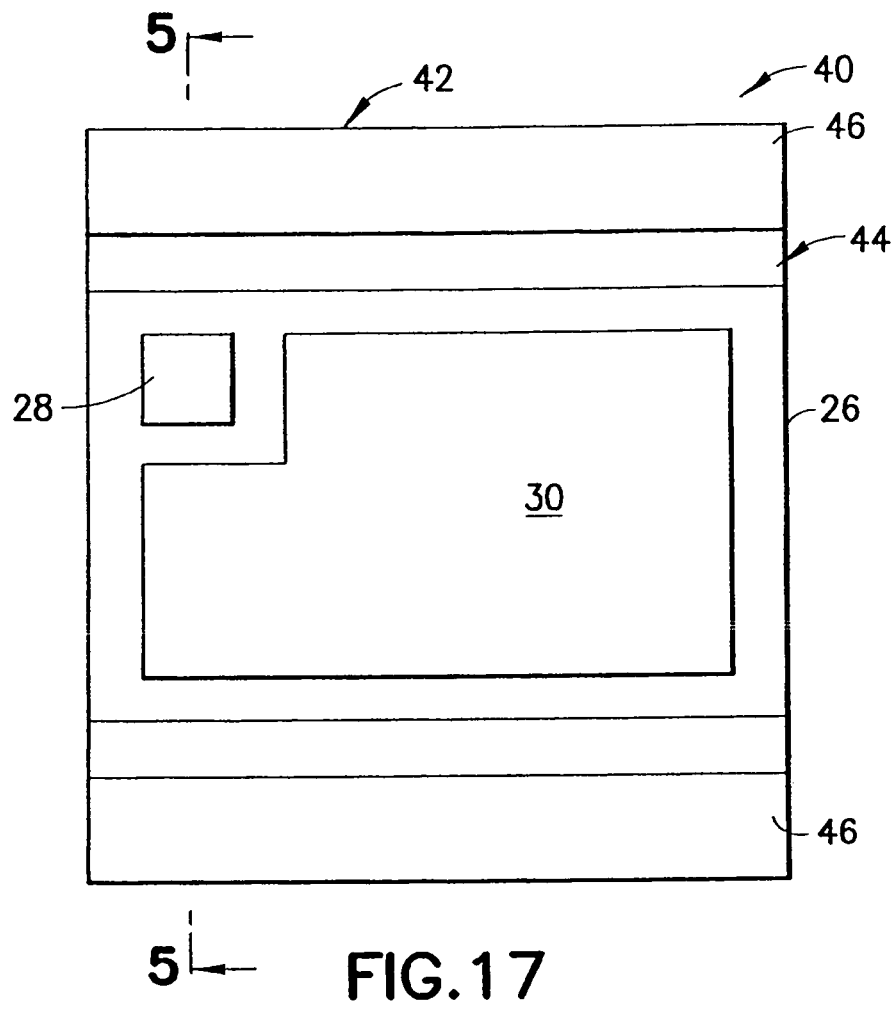
FIG. 17 shows a bottom view of a semiconductor device according to the second embodiment of the present invention.

FIG. 17 shows a second embodiment of a semiconductor device package according to the present invention. As shown in FIG. 17, semiconductor device package 40 includes a clip 42 having a slightly longer width than MOS-gated semiconductor device 26, which is, in this embodiment, a MOSFET having a gate electrode 28 and source electrode 30 disposed on a major surface thereof. Therefore, U-shaped clip 42 has a higher surface area than drain electrode 32 of the die. Drain electrode 32 (FIG. 18) of MOSFET 26 is electrically connected to the plated interior surface 44 of clip 40. Drain electrode 32 (FIG. 18) may be connected to the interior surface of clip 40 by a layer of conductive adhesive 35 such as a conductive epoxy.

Figure 18:
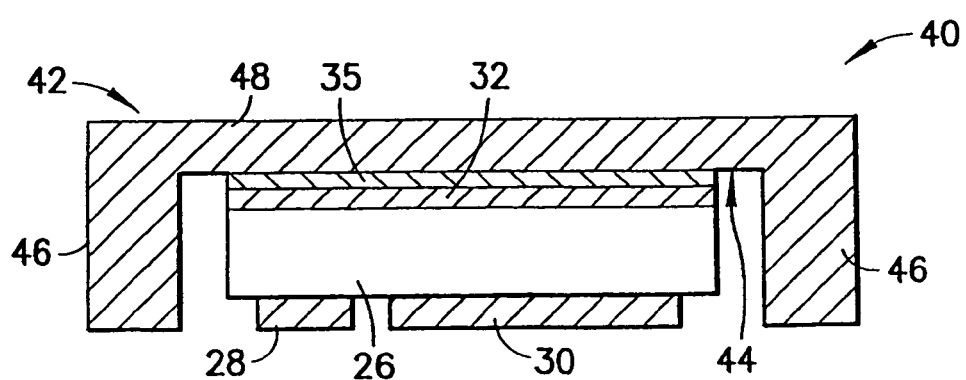
FIG. 18 shows a cross-sectional view of the device shown in FIG. 17 along line 5-5 looking in the direction of the arrows shown.

Referring to FIG. 18, which shows a cross-section of semiconductor device package 40 along line 5-5, clip 42 is generally U-shaped and has shallow legs 46, each extending along an opposing edge of a central web portion 48. The edge of each leg 46 that is connected to an edge of web portion 48 is coextensive with the same. It is believed that the overall resistivity of semiconductor device package 40 to high frequency currents is reduced. The reduction in the resistance in device 40 can be attributed to the relatively higher surface area of the U-shaped clip 42 which allows for a higher current density than conventional leads. Thus, when, due to skin effect, current is pushed to the surface of U-shaped clip 42, it exhibits less resistance. Also, because of its relatively low thickness, U-shaped clip 42 exhibits higher resistivity to eddy currents. The high resistivity to eddy currents leads to less loss of energy through heat that is generated by excessive eddy currents.

Figure 19:
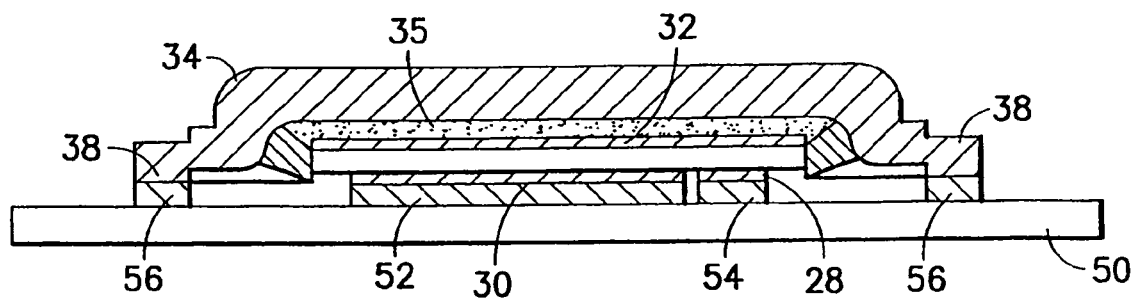
FIG. 19 shows the device shown in FIG. 2 mounted on a substrate.
Figure 20:
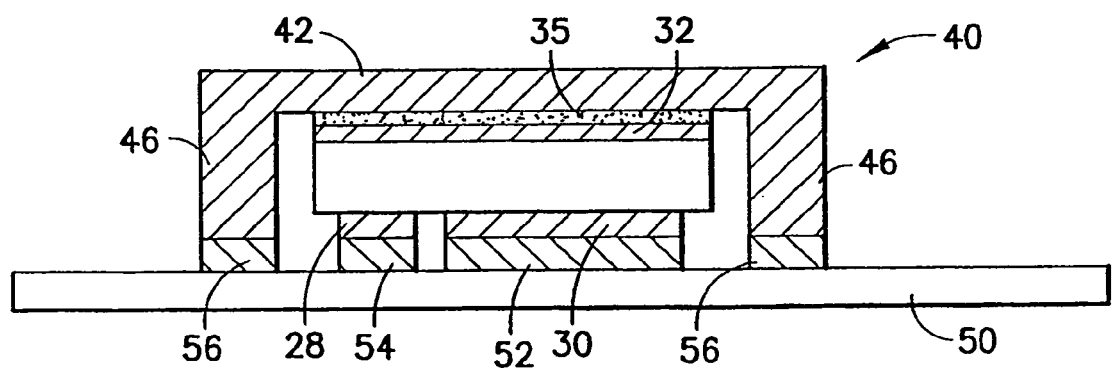
FIG. 20 shows the device shown in FIG. 4 mounted on a substrate.

First embodiment of a semiconductor device package 24 as shown in FIGS. 2 and 3 and second embodiment of semiconductor device package 40 as shown in FIGS. 17 and 18 are mounted on a surface of a substrate as shown in FIGS. 19 and 20, respectively.

Referring to FIG. 19, a semiconductor device package 24 according to the first embodiment is shown to be mounted on a substrate 50, which may be a power circuit board, or an insulated metal substrate (IMS). Substrate 50 has conductive patch 52, gate trace 54 and drain traces 56 disposed on a major surface thereof. Projections 38 of cup-shaped clip 34 are disposed over, and are placed in electrical contact with drain traces 56. Source contact 30 and gate contact 28 of MOSFET 26 are placed in electrical contact with conductive patch 52 and gate trace 54, respectively. Conductive patch 52, gate trace 54 and drain traces 56 are then appropriately connected to other components on the substrate 50.

Referring to FIG. 20, semiconductor device package 40 according to the second embodiment is shown to be mounted on a substrate 50. Shallow legs 46 of clip 42 are placed in electrical contact with drain traces 56, while conductive patch 52 and gate trace 54 are placed in contact with source electrode 30 and gate electrode 28 of MOSFET 26 respectively.

Figure 21:
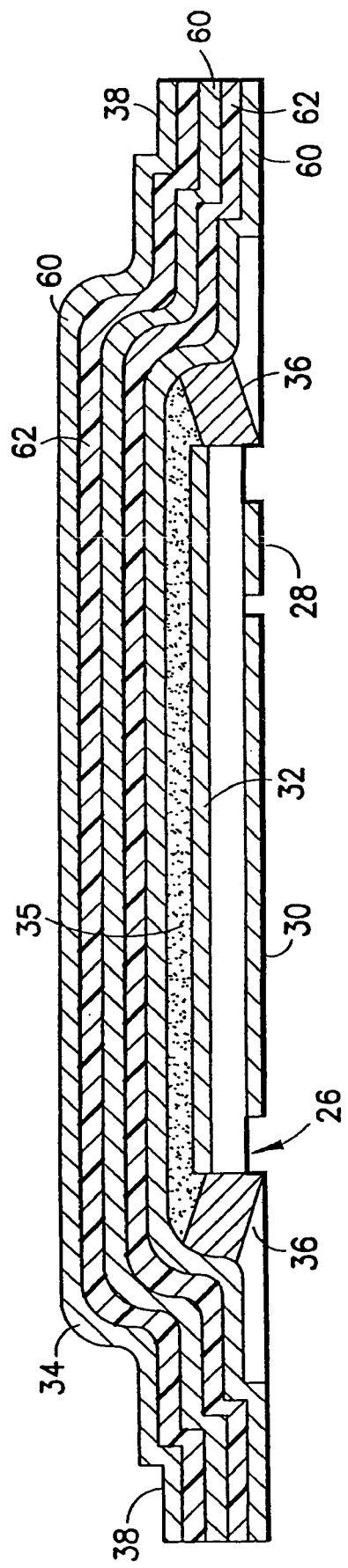
FIG. 21 shows a cross-sectional view of a package in accordance with the present invention, wherein the clip is made from alternating layers of a copper alloy and an insulator laminate.

Referring to FIG. 21, cup-shaped clip 34 may be made from alternating layers of a copper alloy 60 and an insulator 62 laminated to one another. The use of alternating laminates makes it possible to use a thinner layer of copper alloy to achieve a lower resistance due to the skin effect, while providing the necessary mechanical strength for the clip 34.

Thus, the semiconductor device package according to the present invention has lower parasitic resistance at frequencies up to 1 MHz. The package resistance of conventional SMT or TO-220 type power packages at this frequency, in contrast, is considerably increased by skin effect related phenomena, both in aluminum wire bonds and package leads. The use of a source mounted package enables significant improvements in the frequency dependant package parasitic losses.

Board mounted parasitic impedances of die free assemblies of D2PAK, D-PAK, SO-8, MLP and the source mounted power semiconductor package of the present invention have been experimentally determined over the frequency range of 500 kHz to 5 MHz. In all the packages characterized, package resistance is shown to increase significantly with frequency due to suspected skin effect phenomenon. Basic analytical modeling of assemblies used in power package construction has been demonstrated and results support the supposition that the increasing resistance trends are due to skin effects. Parasitic inductance has been shown to decrease with frequency over the range of 500 KHz to 5 MHz.

Analytical modeling of simple assemblies used in power electronic package construction show similar trends. The trends in inductance observed are expected to be a consequence of skin effect phenomenon. The package of the present invention has been shown to have the lowest board mounted resistance and inductance of the packages characterized. Efficiencies and switching waveforms of SO-8 and packaged power MOSFET devices of the present invention have been compared operating in VRM circuits. Comparison of drain to source voltage (VDS) switching waveforms between the two packages show that voltage ringing is significantly lower in a package according to the present invention compared to SO-8. The ratio of SO-8 the board mounted package of the present invention inductance values obtained experimentally using a precision LCR meter are in close agreement to values approximated from VDS switching waveform observations: VRM circuits assembled using package 24 devices show significantly higher power efficiency in comparison to VRM circuits assembled using SO-8 packaged devices. The package 24 based VRM circuits also show significantly increased current handling capability. This is due to the reduced package parasitics and improved thermal performance of the semiconductor device package of the present invention.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A power supply arrangement comprising:
   a semiconductor package, said semiconductor package including a semiconductor die comprising a power MOSFET having first and second major surfaces, first and second major electrodes comprising a drain electrode and a source electrode respectively each on a respective one of said major surfaces, and a gate electrode disposed on said second major surface, and a cup-shaped metal clip having a flat web portion electrically connected directly to said drain electrode by a layer of conductive adhesive; and a power supply source comprising a buck converter supplying current to said semiconductor package at a frequency of at least 1 Mhz, wherein thickness of said cup-shaped metal clip is configured to reduce resistance caused by the skin effect to obtain an efficiency of higher than 70% for an output current of 10 Amps or higher.

2. The arrangement of claim 1, wherein said metal clip is comprised of copper.

3. The arrangement of claim 1, wherein said metal clip is plated with silver.

4. The arrangement of claim 1, wherein said thickness of said metal clip is at least four skins deep.

5. The arrangement of claim 1, wherein said thickness of said metal clip is at least four skins deep but no more than ten skins deep.

6. The arrangement of claim 1, wherein said cup-shaped metal clip includes two rows of projections at opposing edges of said clip.

7. The arrangement of claim 1, wherein said cup-shaped metal clip includes a projection at a respective edge of said clip.

8. The arrangement of claim 1, further comprising a polymeric ring disposed around said die.

9. The arrangement of claim 8, wherein said polymeric ring comprises an epoxy.

10. The arrangement of claim 1, further comprising a passivation body on said die, said passivation body acting as a solder resist when said package is mounted on a circuit board.

11. The arrangement of claim 1, wherein said efficiency is less than or equal to 84%.

12. The arrangement of claim 1, wherein said output current is less than or equal 100 Amps.

13. The arrangement of claim 1, wherein said power supply source is a multi-phase buck converter.

* * * * *